(12) United States Patent
Arai et al.

(10) Patent No.: US 11,057,038 B2
(45) Date of Patent: Jul. 6, 2021

(54) SEMICONDUCTOR DEVICE INCLUDING BUFFER CIRCUIT

(71) Applicant: Micron Technology, Inc., Boise, ID (US)

(72) Inventors: Tetsuya Arai, Sagamihara (JP); Shuichi Tsukada, Sagamihara (JP); Junki Taniguchi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/656,415

(22) Filed: Oct. 17, 2019

(65) Prior Publication Data

US 2020/0052698 A1 Feb. 13, 2020

Related U.S. Application Data

(63) Continuation of application No. 15/220,310, filed on Jul. 26, 2016, now Pat. No. 10,511,306.

(30) Foreign Application Priority Data

Jun. 1, 2016 (JP) .................................. 2016-109861

(51) Int. Cl.
*H03K 19/00* (2006.01)
*G11C 5/14* (2006.01)
(Continued)

(52) U.S. Cl.
CPC .......... *H03K 19/0005* (2013.01); *G11C 5/14* (2013.01); *G11C 7/1057* (2013.01);
(Continued)

(58) Field of Classification Search
None
See application file for complete search history.

(56) References Cited

U.S. PATENT DOCUMENTS

| 5,606,275 A | 2/1997 | Farhang et al. |
| 6,208,168 B1 | 3/2001 | Rhee |

(Continued)

FOREIGN PATENT DOCUMENTS

| KR | 10-0895383 B1 | 4/2009 |
| TW | 506192 B | 10/2002 |

(Continued)

OTHER PUBLICATIONS

Second Office Action for Taiwanese Application No. 106118116 dated Jul. 23, 2019.

(Continued)

*Primary Examiner* — Amy Cohen Johnson
*Assistant Examiner* — James H Cho
(74) *Attorney, Agent, or Firm* — Dorsey & Whitney LLP

(57) ABSTRACT

A device includes a power supply line, an output terminal, a circuit configured to perform a logic operation on a first signal and a second signal to produce a third signal, first, second and third transistors. The first transistor is coupled between the power supply line and the output terminal and includes a control gate supplied with the third signal. The second and third transistors are coupled in series between the power supply line and the output terminal. The second transistor includes a control gate supplied with the first signal and the third transistor includes a control gate supplied with a fourth signal that is different from each of the first, second and third signals.

16 Claims, 16 Drawing Sheets

(51) Int. Cl.
*G11C 7/10* (2006.01)
*G11C 29/02* (2006.01)
*G11C 29/50* (2006.01)

(52) U.S. Cl.
CPC .......... *G11C 29/022* (2013.01); *G11C 29/028* (2013.01); *G11C 29/50008* (2013.01); *H03K 19/0013* (2013.01); *G11C 2207/2254* (2013.01)

(56) References Cited

U.S. PATENT DOCUMENTS

| | | |
|---|---|---|
| 6,624,662 B1 | 9/2003 | Volk |
| 7,068,065 B1 | 6/2006 | Nasrullah |
| 7,109,744 B1 | 9/2006 | Shumarayev et al. |
| 7,176,729 B2 | 2/2007 | Hayashi et al. |
| 7,443,194 B1 | 10/2008 | Chen et al. |
| 7,791,367 B1 | 9/2010 | Pelley |
| 7,911,225 B2 * | 3/2011 | Ahn ................ G11C 7/1051 326/30 |
| 7,961,001 B1 | 6/2011 | Ko |
| 8,471,602 B2 | 6/2013 | Lee |
| 9,048,824 B2 * | 6/2015 | Chan .................. H03K 19/0005 |
| 2003/0025535 A1 * | 2/2003 | Raychaudhuri .... H03K 19/0005 327/108 |
| 2004/0164763 A1 | 8/2004 | Kim et al. |
| 2008/0100334 A1 | 5/2008 | Kim et al. |
| 2008/0170063 A1 | 7/2008 | Ryu et al. |
| 2008/0204070 A1 | 8/2008 | Chen et al. |
| 2009/0072860 A1 | 3/2009 | Lee |
| 2009/0289658 A1 * | 11/2009 | Moon ................... G11C 5/063 326/30 |
| 2010/0045338 A1 | 2/2010 | Kodato |
| 2013/0015880 A1 * | 1/2013 | Haraguchi ....... H03K 19/00369 326/30 |
| 2013/0088257 A1 | 4/2013 | Hara |
| 2015/0022282 A1 | 1/2015 | Kaneko et al. |
| 2015/0341019 A1 * | 11/2015 | Jung .................... H03K 3/012 327/108 |
| 2017/0353183 A1 | 12/2017 | Arai et al. |

FOREIGN PATENT DOCUMENTS

| | | |
|---|---|---|
| TW | 201228221 A | 7/2012 |
| TW | 201412016 A | 12/2017 |
| WO | 2011011756 A1 | 1/2011 |
| WO | 20170210024 A1 | 12/2017 |

OTHER PUBLICATIONS

First Office Action dated Dec. 6, 2018 for TW Application No. 106118116.
International Preliminary Report on Patentability dated Dec. 13, 2018 for PCT Application No. PCT/US2017/034046.
International Search Report and Written Opinion dated Aug. 16, 2017 for PCT Application No. PCT/US2017/034046.
English translation of KR Office Action for Application No. 10-20187035436, dated Feb. 21, 2020.
Extended European Search Report for Application No. 17807246.8, dated Jan. 24, 2020.
English translation of KR Office Action dated Sep. 23, 2020 for KR Application No. 10-2018-7035436.
English translation of KR Office Action dated Mar. 18, 2021 for KR Application No. 10-2018-7035436.

* cited by examiner

SEMICONDUCTOR DEVICE INCLUDING BUFFER CIRCUIT

CROSS-REFERENCE TO RELATED APPLICATION(S)

This application is a continuation of U.S. patent application Ser. No. 15/220,310, filed Jul. 26, 2016 and issued as U.S. Pat. No. 10,511,306 on Dec. 17, 2019, which is based upon and claims the benefit of priority from Japanese Patent Application No. 2016-109861 filed on Jun. 1, 2016. These applications and patents are incorporated by reference herein in their entirety and for all purposes.

BACKGROUND

The present invention relates to a semiconductor device, and in particular, to a semiconductor device provided with a buffer circuit including a plurality of output drivers that are connected in parallel with each other.

As disclosed in U.S. Pat. Nos. 6,208,168 and 7,961,001, a buffer circuit for driving output terminals includes a plurality of output drivers that are connected in parallel with each other. This configuration makes it possible to finely adjust the impedance of a signal outputted from an output terminal by selecting an output driver to be activated based upon an impedance code.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to forma new embodiments.

Figure 1:
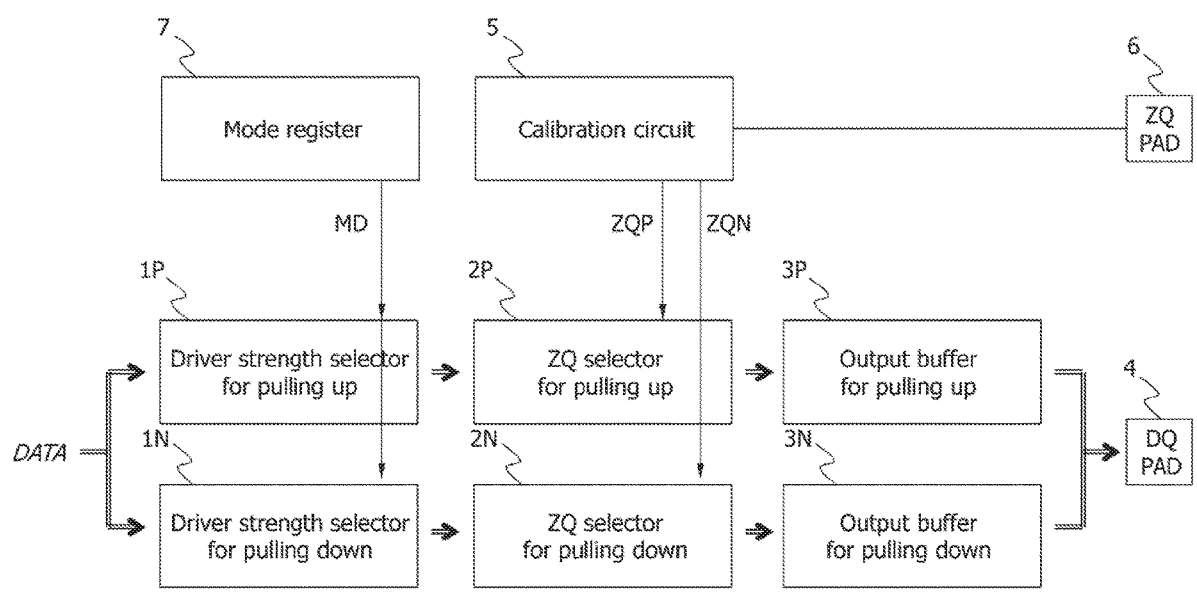
FIG. 1 is a block diagram for explaining a configuration of an output circuit of a semiconductor device.

FIG. 1 is a block diagram for use in explaining the configuration of an output circuit of a semiconductor device.

Figure 2:
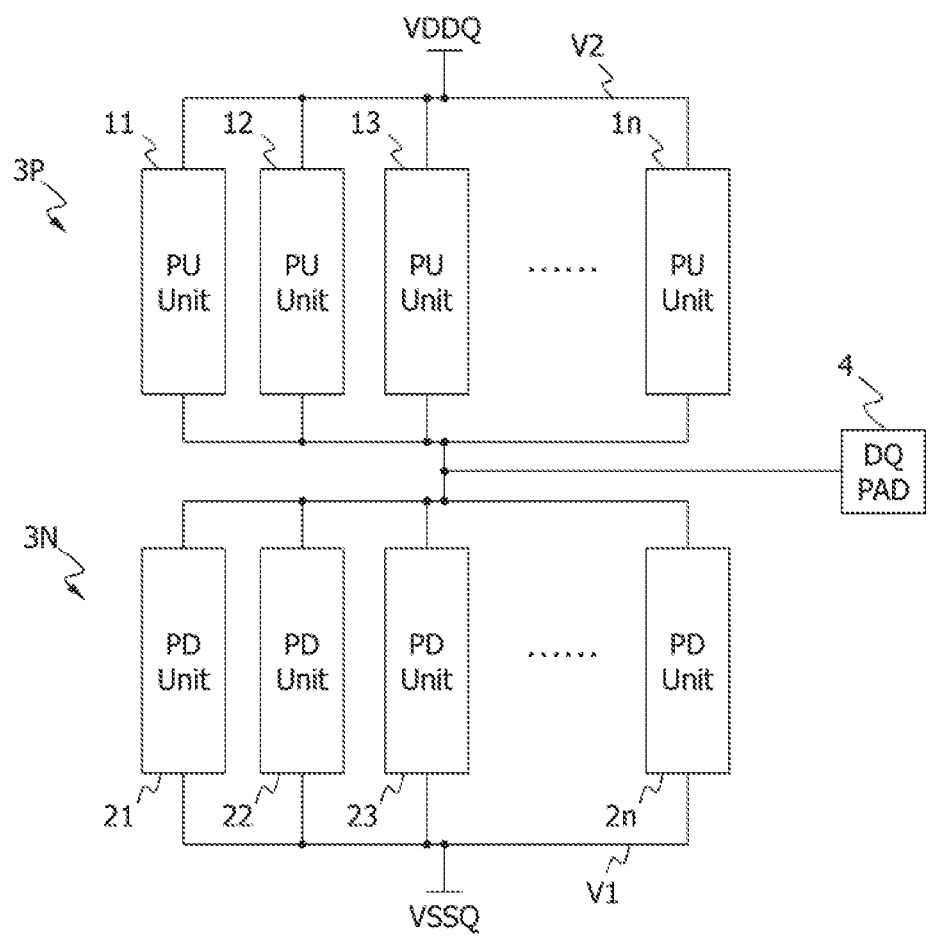
FIG. 2 shows circuit diagrams of an output buffer for pull-up and an output buffer 3N for pull-down.

The output circuit shown in FIG. 1 is a circuit for driving a DQ pad 4 serving as an output terminal. To the DQ pad 4, a pull-up output buffer 3P and a pull-down output buffer 3N are connected. As shown in FIG. 2, the pull-up output buffer 3P includes a plurality of pull-up units 11, 12, 13 . . . 1$n$ that are connected in parallel with each other. The pull-down buffer 3N includes a plurality of pull-down units 21, 22, 23 . . . 2$n$ that are connected in parallel with each other. The pull-up units 11, 12, 13, . . . 1$n$ are connected in parallel with each other between a power supply line V2 to which a power supply potential VDDQ is supplied and a DQ pad 4. The pull-down units 21, 22, 23 . . . 2$n$ are connected in parallel with each other between a power supply line V1 to which a ground potential VSSQ is supplied and the DQ pad 4. The impedances of the pull-up units 11, 12, 13 . . . 1$n$ may be set to mutually the same, or at least one portion thereof may be weighted. In the same manner, the impedances of the pull-down units 21, 22, 23 . . . 2$n$ may be set to mutually the same, or at least one portion thereof may be weighted.

As will be described later in detail, each of these pull-up units 11, 12, 13, . . . , 1$n$ and pull-down units 21, 22, 23 . . . 2$n$ has a configuration in which a plurality of output drivers are connected in parallel with each other. Each of the output drivers is activated by ZQ selectors 2P and 2N that are located at preceding stages. The ZQ selector 2P adjusts the impedances of the pull-up units 11, 12, 13 . . . 1$n$ by controlling the pull-up output buffer 3P. The ZQ selector 2N adjusts the impedances of the pull-down units 21, 22, 23 . . . 2$n$ by controlling the pull-down output buffer 3N. The ZQ selector 2P carries out the impedance adjustment based upon an impedance code ZQP supplied from a calibration circuit 5. The impedance adjustment by the ZQ selector 2N is carried out based upon an impedance code ZQN supplied from the calibration circuit 5. The calibration circuit 5, which is connected to a ZQ pad 6, generates the impedance codes ZQP and ZQN by referring to the impedance of the ZQ pad 6 in response to a calibration command.

Driver strength selectors 1P and IN are respectively provided on preceding stages of the ZQ selectors 2P and 2N. The driver strength selector 1P is a circuit for making a selection as to which pull-up units 11, 12, 13 . . . 1$n$ should be activated (how many units should be activated). The driver strength selector 1N is a circuit for making a selection as to which pull-down units 21, 22, 23 . . . 2$n$ should be activated (how many units should be activated). The driver strength selector 1P or 1N is selected based upon a mode signal MD supplied from a mode register 7. The setting contents of the mode register 7 can be rewritten by a user's operation; thus, the pull-up output buffer 3P and the pull-down output buffer 3N can be operated by a desired driver strength. Inner data DATA indicating the logical level of data to be outputted from the DQ pad 4 is supplied to the driver strength selectors 1P and 1N.

Figure 16:
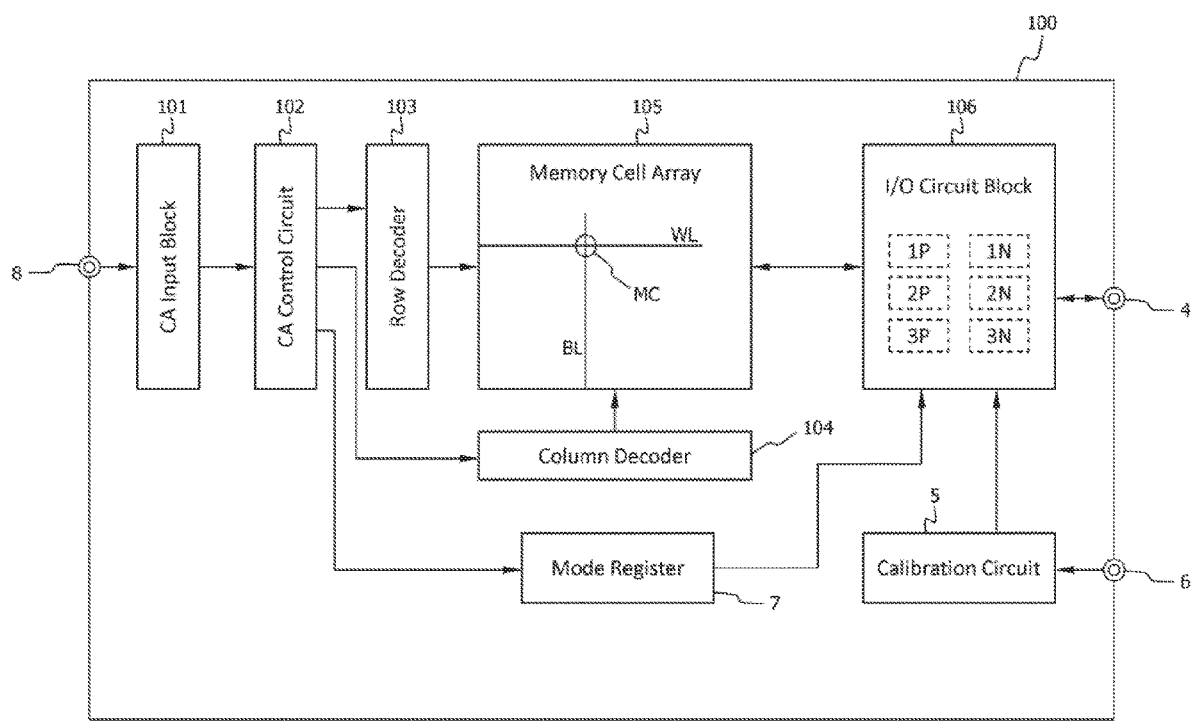
FIG. 16 is a block diagram for explaining the entire configuration of the semiconductor device

FIG. 16 is a block diagram for use in explaining the entire configuration of a semiconductor device in accordance with the present embodiment.

As shown in FIG. 16, in addition to the above-mentioned DQ pad 4 and ZQ pad 6, a semiconductor device 100 includes a CA pad 8 as an external terminal. The CA pad 8 is the external terminal to which a command address signal is inputted externally. The command address signal inputted to the CA pad 8 is supplied to a command address control circuit 102 through a command address input block 101. The command address control circuit 102 supplies a row address of the command address signal to a row decoder 103 and a column address thereof to a column decoder 104. Moreover, a mode signal included in the command address signal CA is supplied to the mode register 7.

The semiconductor device 100 includes a memory cell allay 105. The memory cell array 105 includes a plurality of word lines WL and a plurality of bit lines BL, with memory cells MC being arranged at the respective intersections of these. The word line WL is selected by the row decoder 103, and the bit line BL is selected by the column decoder 104. The memory cell MC selected by the row decoder 103 and column decoder 104 is electrically connected to an input/output circuit block 106. The input/output circuit block 106 includes the above-mentioned driver strength selectors 1P and 1N as well as ZQ selectors 2P and 2N, and pull-up output buffer 3P and pull-down output buffer 3N.

Next, the following description will discuss circuit configurations of the ZQ selector 2N and the pull-down unit 21.

In this case, prior to explaining the circuit configurations of the ZQ selector 2N and the pull-down unit 21 of the present embodiment, explanations will be given to the circuit configurations of a ZQ selector 2N and a pull-down unit 21 in accordance with a prior art.

Figure 3:
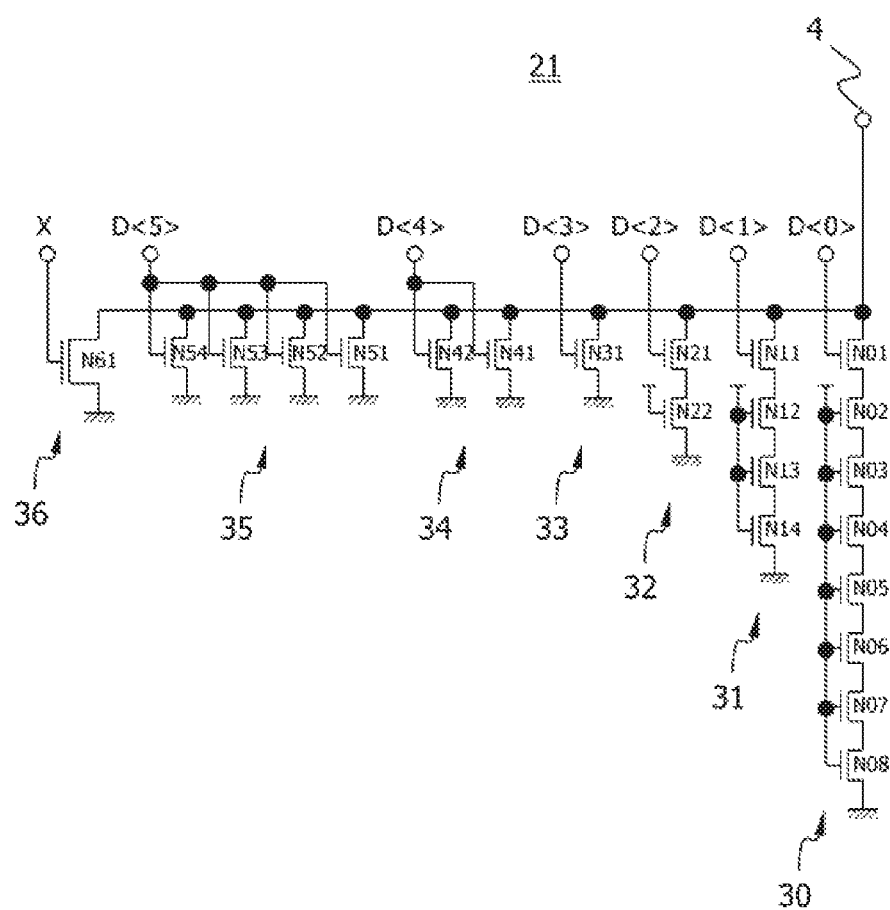
FIG. 3 shows a circuit diagram of a pull-down unit in accordance with a prior art.

FIG. 3 shows the circuit diagram of the pull-down unit 21 in accordance with the prior art.

The pull-down unit 21 in FIG. 3 has a configuration in which a plurality of output drivers 30 to 36 are connected in parallel with each other. The output drivers 30 to 35 are output drivers in which impedances are weighted by powers of 2, and respectively controlled by control signals D<0> to D<5> supplied from the ZQ selector 2N. On the other hand, the output driver 36, which is a driver for use in biasing a resistance value, is turned ON/OFF irrespective of the control signals D<0> to D<5>. In the case when the inner data DATA is set to a low-level output at the time of a reading operation, the value of each of the control signals D<0> to D<5> is coincident with the value of the impedance code ZQN.

The output driver 30 includes eight N-channel type MOS transistors N01 to N08 that are connected in series with each other between the DQ pad 4 and the power supply line V1. The control signal D<0> supplied from the ZQ selector 2N is supplied to the gate electrode of the transistor N01. The gate electrodes of the other transistors N02 to N08 receives a power supply potential that is the same as a potential used upon activating the control signal D<0> in a fixed manner so as to be always kept ON. Therefore, at the time of activation, the impedance of the output driver 30 becomes 8 times as high as the impedance of the single transistor.

The output driver 31 includes four N-channel type MOS transistors N11 to N14 that are connected in series with each other between the DQ pad 4 and the power supply line V1. The gate electrode of the transistor N11 revives the control signal D<1> supplied from the ZQ selector 2N. The gate electrodes of the other transistors N12 to N14 receives a power supply potential that is the same as a potential used upon activating the control signal D<1> in a fixed manner so as to be always kept ON. Therefore, at the time of activation, the impedance of the output driver 31 becomes 4 times as high as the impedance of the single transistor.

The output driver 32 includes two N-channel type MOS transistors N21 and N22 that are connected in series with each other between the DQ pad 4 and the power supply line V1. The gate electrode of the transistor N21 receives the control signal D<2> supplied from the ZQ selector 2N. The gate electrode of the other transistor N22 receives a power supply potential that is the same as a potential used upon activating the control signal D<2> in a fixed manner so as to be always kept ON. Therefore, at the time of activation, the impedance of the output driver 32 becomes 2 times as high as the impedance of the single transistor.

The output driver 33 includes one N-channel type MOS transistor N31 that is series connected between the DQ pad 4 and the power supply line V1. The gate electrode of the transistor N31 receives the control signal D<3> supplied from the ZQ selector 2N. Therefore, at the time of activation, the impedance of the output driver 33 is the same as the impedance of the single transistor.

The output driver 34 includes two N-channel type MOS transistors N41 and N42 that are connected in parallel with each other between the DQ pad 4 and the power supply line V1. The gate electrodes of the transistors N41 and N42 receive the control signal D<4> supplied from the ZQ selector 2N. Therefore, upon activation, the impedance of the output driver 34 becomes ½ of the impedance of the single transistor.

The output driver 35 includes four N-channel type MOS transistors N51 to N54 that are connected in parallel with each other between the DQ pad 4 and the power supply line V1. The gate electrodes of the transistors N51. to N54 receive the control signal D<5> supplied from the ZQ selector 2N. Therefore, upon activation, the impedance of the output driver 35 becomes ¼ of the impedance of the single transistor.

The transistor sizes such as channel length and channel width of these transistors constituting the output drivers 30 to 35 are mutually the same.

The output driver 36 includes an N-channel type MOS transistor N61 having a large transistor size, connected between the DQ pad 4 and the power supply line V1. A selection signal X for use in activating the pull-down output buffer 3N is supplied to the gate electrode of the transistor N61. The selection signal X is a signal that is activated when the inner data DATA is set to a low-level output at the time of a reading operation. Therefore, in the case when the inner data DATA is set to the low-level output, the output driver 36 is activated irrespective of the control signals D<0> to D<5>.

Figure 4:
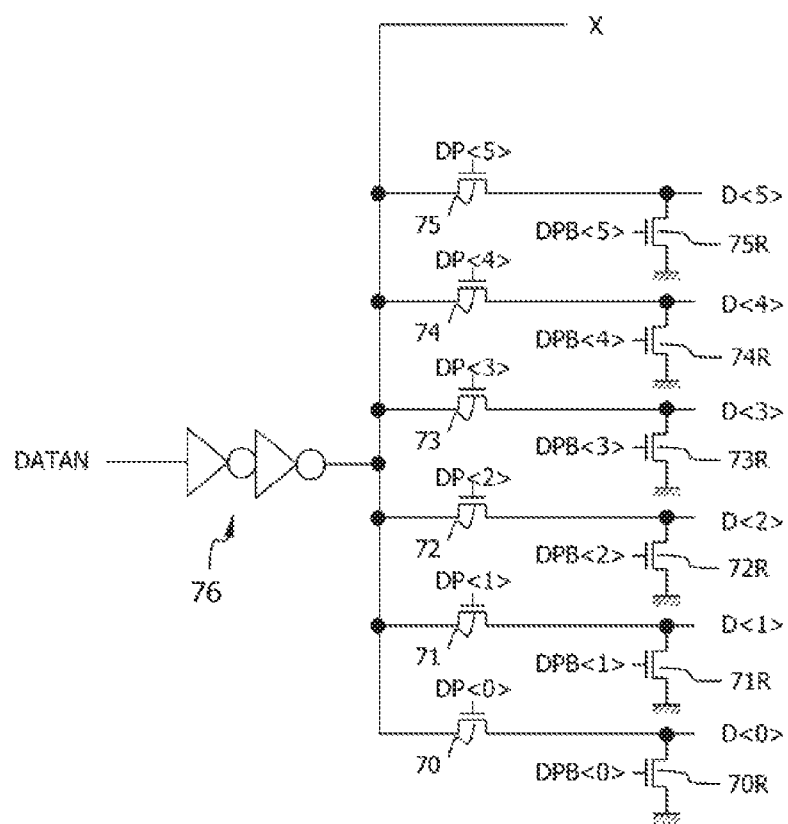
FIG. 4 shows a circuit diagram of a ZQ selector in accordance with a prior art.

FIG. 4 is a circuit diagram showing a ZQ selector 2N in accordance with the prior art.

The ZQ selector 2N shown in FIG. 4 includes a driver 76 for use in buffering pull down data DATAN, six pass gates 70 to 75 that are connected in parallel with the output node of the driver 76 and level holding transistors 70R to 75R which are connected to the respective output nodes of the pass gates 70 to 75 and when any one of the pass gates 70 to 75 is turned off, fix the potential of its output node to a non-activation level. The pull down data DATAN forms a signal that is activated when the inner data DATA is set to a low-level output at the time of a reading operation. Each of the pass gates 70 to 75 is an N-channel type MOS transistor, and control signals DP<0> to DP<5> forming impedance codes ZQN are respectively supplied to the respective gate electrodes. The level holding transistors 70R to 75R respectively receive inverted logical signals DPB<0> to DPB<5> of the control signals DP<0> to DP<5>. The outputs of the pass gates 70 to 75 are respectively used as the control signals D<0> to D<5>. The output signal of the driver 76, as it is, is used as the selection signal X.

When the pull down data DATAN is activated, one or two or more of the output drivers 30 to 36 are activated based upon the values of the control signals DP<0> to DP<5> constituting the impedance code ZQN so that the DQ pad 4 is driven to the low level (VSSQ). Therefore, the impedance of the single pull-down unit 21 is finely adjusted by the impedance code ZQP.

Since the ZQ selector 2N shown in FIG. 4 simply uses the pass gates 70 to 75, the fan-out of the driver 76 is greatly fluctuated by the impedance code ZQP. For this reason, the screw rate of the output data waveform, propagation delays of the control signals DP<0> to DP<5>, the degree of waveform distortion, etc. are greatly fluctuated depending on the impedance code. Moreover, since the resistance values of the pass gates 70 to 75 are hardly ignored, and since the level holding transistors 70R to 75R also exert as capacitive loads, it is necessary to increase the size of the driver 76 in order to realize a waveform having a fast screw rate through the pass gates 70 to 75, with the result that current consumption undesirably increases.

Figure 5:
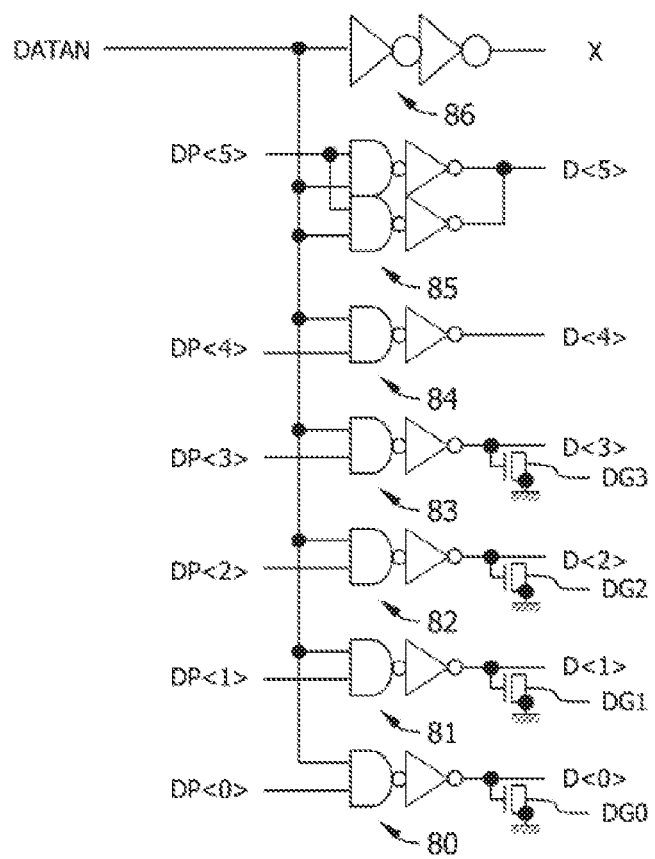
FIG. 5 shows a circuit diagram of a ZQ selector in accordance with a prior art.

FIG. 5 is a circuit diagram showing a ZQ selector 2N in accordance with a second prior art.

The ZQ selector 2N shown in FIG. 5 includes AND gate circuits 80 to 85 and a driver 86 for use in buffering pull down data DATAN. One of the input nodes of each of the AND gate circuits 80 to 85 receives pull down data DATAN. The other input nodes thereof, respectively receive control signals DP<0> to DP<5> forming the impedance code ZQN. The outputs of the AND gate circuits 80 to 85 are respectively used as control signals D<0> to D<5>. Moreover, the output signal of the driver 86 is used as the selection signal X.

In the same manner as in the case of using the ZQ selector 2N shown in FIG. 4, when the pull down data DATAN is activated, one or two or more of the output drivers 30 to 36 are activated based upon the values of the control signals DP<0> to DP<5> constituting the impedance code ZQN so that the DQ pad 4 is driven to the low level (VSSQ). Therefore, the impedance of the single pull-down unit 21 is finely adjusted by the impedance code ZQP.

Since the ZQ selector 2N shown in FIG. 5 has its control signals D<0> to D<5> assigned with the AND gate circuits 80 to 85, this structure allows to eliminate the above-mentioned problems raised in the case of using the ZQ selector 2N shown in FIG. 4. in particular, in the ZQ selector 2N shown in FIG. 5, by increasing the driving capability of the AND gate circuit 85 two times as high, as well as by using dummy gate capacities DG0 to DG3, the fan-outs of the AND gate circuits 80 to 85 are made coincident with each other.

More specifically, in the case of using the output driver 34 as a reference, in comparison with the AND gate circuit 84 for driving this, the fan-outs of the AND gate circuits 80 to 83 for driving the output drivers 30 to 33 become smaller, while in contrast, the fan-out of the AND gate circuit 85 for driving the output driver 35 becomes larger. This is because the output driver 34 forming the reference is constituted by parallel circuits of two transistors N41 and N42 so that the control signal D<4> is supplied to the two gate electrodes, while the control signals D<0> to D<3> are respectively supplied to a single gate electrode, with the control signal D<5> being supplied to the four gate electrodes.

In order to eliminate such a difference, the ZQ selector 2N shown in FIG. 5 is designed such that dummy capacities DG0 to DG3 are respectively connected to the output nodes of the AND gate circuits 80 to 83, with the driving capability of the AND gate 85 being two times as high as that of the AND gate circuit 84. Each of the dummy gate capacities DG0 to DG3 is a gate capacity (MOS capacity) of the MOS transistor, and its transistor size is the same as the transistor size of each of transistors constituting the output drivers 30 to 35.

Therefore, since the fan-outs of the AND gate circuits 80 to 85 are made mutually coincident, this allows to eliminate the problem raised by the ZQ selector 2N shown in FIG. 4. However, since the ZQ selector 2N shown in FIG. 5 needs a large number of dummy gate capacities required for aligning fan-outs, with the result that current consumption increases. This problem becomes more conspicuous as the number of the output drivers constituting the pull-down unit 21 increases. Therefore, there is a demand for a circuit configuration capable of reducing the number of required dummy gate capacities, while making the fan-outs coincident with each other.

Figure 6:
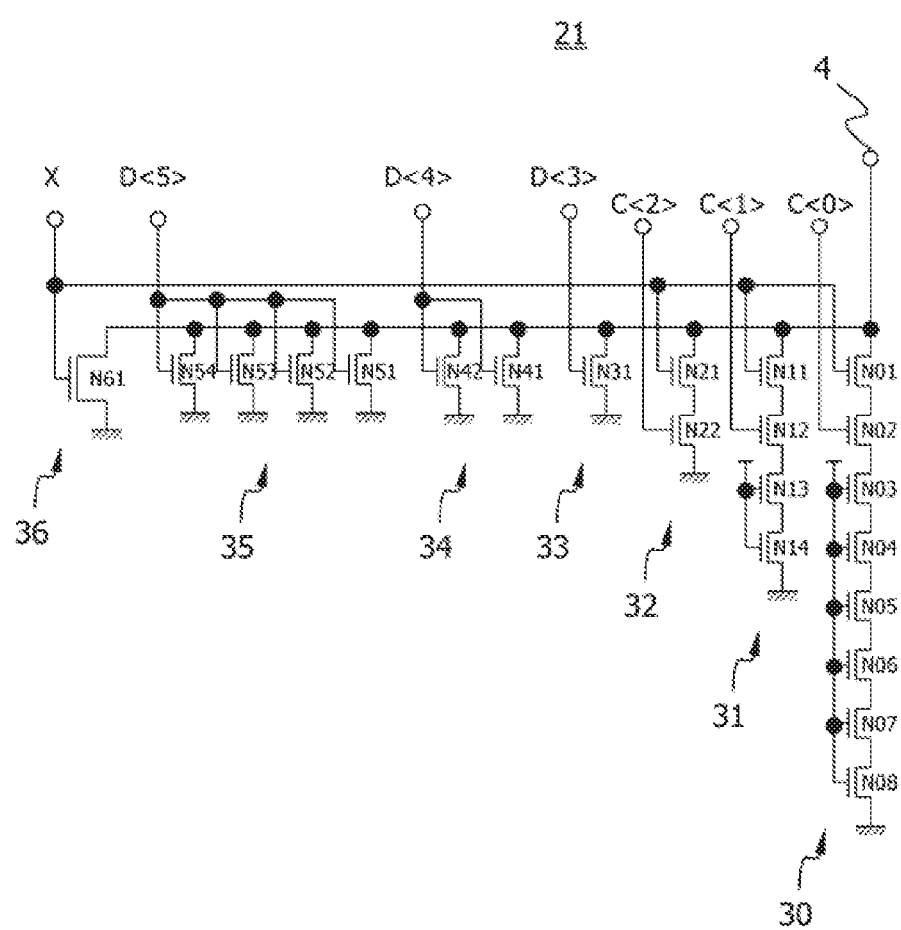
FIG. 6 shows a circuit diagram of a pull-down unit in accordance with a first embodiment.

FIG. 6 is a circuit diagram showing a pull-down unit 21 in accordance with a first embodiment.

As shown in FIG. 6, in the same manner as in the pull-down unit 21 shown in FIG. 3, its pull-down unit 21 has a configuration in which a plurality of output drivers 30 to 36 are connected in parallel with each other. The output drivers 30 to 35 are output drivers in which impedances are weighted by powers of 2, and respectively controlled by control signals C<0> to C<2> and D<3> to D<5> supplied from the ZQ selector 2N. On the other hand, the output driver 36, which is a driver for use in biasing a resistance value, is turned ON/OFF irrespective of the control signals C<0> to C<2> and D<3> to D<5>.

The output driver 30 includes eight N-channel type MOS transistors N01 to N08 that are connected in series with each other between the DQ pad 4 and the power supply line V1. The gate electrode of the transistor N01 receives a selection signal X. The gate electrode of the transistor N02 receives a control signal C<0> supplied from the ZQ selector 2N. The gate electrodes of the other transistors N03 to N08 receive a power supply potential that is the same as a potential used upon activating the selection signal X and the control signal C<0> in a fixed manner so as to be always kept ON. Therefore, at the time of activation, the impedance of the output driver 30 becomes 8 times as high as the impedance of the single transistor.

The output driver 31 includes four N-channel type MOS transistors N11 to N14 that are connected in series with each other between the DQ pad 4 and the power supply line V1. The gate electrode of the transistor N11 receives the selection signal X. The gate electrode of the transistor N12 receives a control signal C<1> supplied from the ZQ selector 2N. The gate electrodes of the other transistors N13 and N14 receive a power supply potential that is the same as a potential used upon activating the selection signal X and the control signal C<1> in a fixed manner so as to be always kept ON. Therefore, at the time of activation, the impedance of the output driver 31 becomes 4 times as high as the impedance of the single transistor.

The output driver 32 includes two N-channel type MOS transistors N21 and N22 that are connected in series with each other between the DQ pad 4 and the power supply line V1. The gate electrode of the transistor N21 receives the selection signal X. The gate electrode of the transistor N22 receives the control signal C<2> supplied from the ZQ selector 2N. Therefore, at the time of activation, the impedance of the output driver 32 becomes 2 times as high as the impedance of the single transistor.

The configuration of each of the output drivers 33 to 36 is the same as that of the pull-down unit 21 shown in FIG. 3. Therefore, at the time of activation, the impedances of the output drivers 33 to 35 are respectively set to equal, a multiple of ½ and a multiple of ¼ relative to the impedance of the single transistor. Transistor sizes of these transistors forming the output drivers 30 to 35 are mutually the same. Moreover, in the case when the inner data DATA is set to the low-level output, the output driver 36 is activated irrespective of the control signals D<0> to D<5>.

Figure 7:
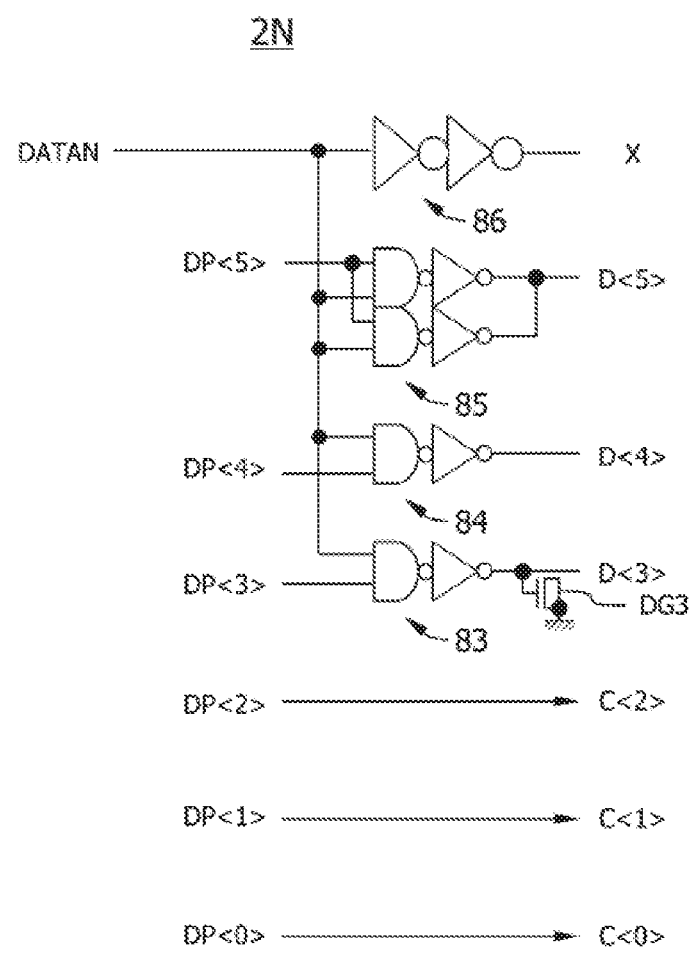
FIG. 7 shows a circuit diagram of a ZQ selector in accordance with a first embodiment.

FIG. 7 is a circuit diagram showing a ZQ selector 2N in accordance with the first embodiment.

The ZQ selector 2N shown in FIG. 7 includes AND gate circuits 83 to 85, and a driver 86 for use in buffering pull down data DATAN. That is, this corresponds to a configuration where from the ZQ selector 2N of the second reference example shown in FIG. 5, the AND gate circuits 80 to 82 and the dummy gate capacities DG0 to DG2 are omitted. One of input nodes of each of the AND gate circuits 83 to 85 receives pull down data DATAN. The other input nodes respectively receive control signals DP<3> to DP<5> forming impedance codes ZQN. The outputs of the AND gate circuits 83 to 85 are respectively used as control signals D<3> to D<5>. Moreover, the output signal of the driver 86 is used as the selection signal X. Furthermore, the control signals DP<0> to DP<2> forming impedance codes ZQN, as they are, are respectively used as the control signals C<0> to C<2>.

Operations of the pull-down unit 21 upon activation of each of the control signals D<3> to D<5> are carried out in the same manner as explained earlier. On the other hand, operations thereof upon activation of each of the control signals C<0> to C<2> correspond to an AND operation with the selection signal X in each of the corresponding output drivers 30 to 32. That is, the output driver 30 is activated when both of the control signal C<0> and the selection signal X are set to the high level. The output driver 31 is activated when both of the control signal C<1> and the selection signal X are set to the high level. The output driver 32 is activated when both of the control signal C<2> and the selection signal X are set to the high level.

Since the control signals C<0> to C<2> are activated in cooperation with the selection signal X, the selection signal X is also always set to the high level, during the period in which the control signals C<0> to C<2> are set to the high level.

Since the transistors N02, N12 and N22 to which the control signals C<0> to C<2> are inputted are respectively connected in series with the transistors N01, N11 and N21 to which the selection signal is inputted, the operation timings of the output drivers 30 to 32 are determined substantially by the selection signal X. For this reason, as long as the transition timing of each of the control signals C<0> to C<2> is faster than that of the selection signal X, it is not necessary to make the transition timings of the control signals C<0> to C<2> coincident with the transition timings of the control signals D<3> to D<5>; therefore, the control signals DP<0> to DP<2>, as they are, may be used as the control signals C<0> to C<2>.

Therefore, in the present embodiment, the dummy gate capacities DG0 to DG2 that are required for the ZQ selector 2N in accordance with the second reference example shown in FIG. 5 become unnecessary. More specifically, supposing that the gate capacity of a transistor N61 forming the output driver 36 is A and that the gate capacity of each of the transistors constituting the output drivers 30 to 35 is B, the ZQ selector 2N in accordance with the second reference example shown in FIG. 5 needs to drive a gate capacity of A+14B in total; in contrast, the ZQ selector 2N in accordance with the first embodiment shown in FIG. 7 only needs to drive a gate capacity of A+11B in total. in other words, the gate capacity corresponding to the 3 gates can be reduced. Moreover, since the sizes of the transistors constituting the output drivers 30 to 35 are mutually the same, there are hardly any deviations in impedance caused by production deviations or the like.

Figure 8:
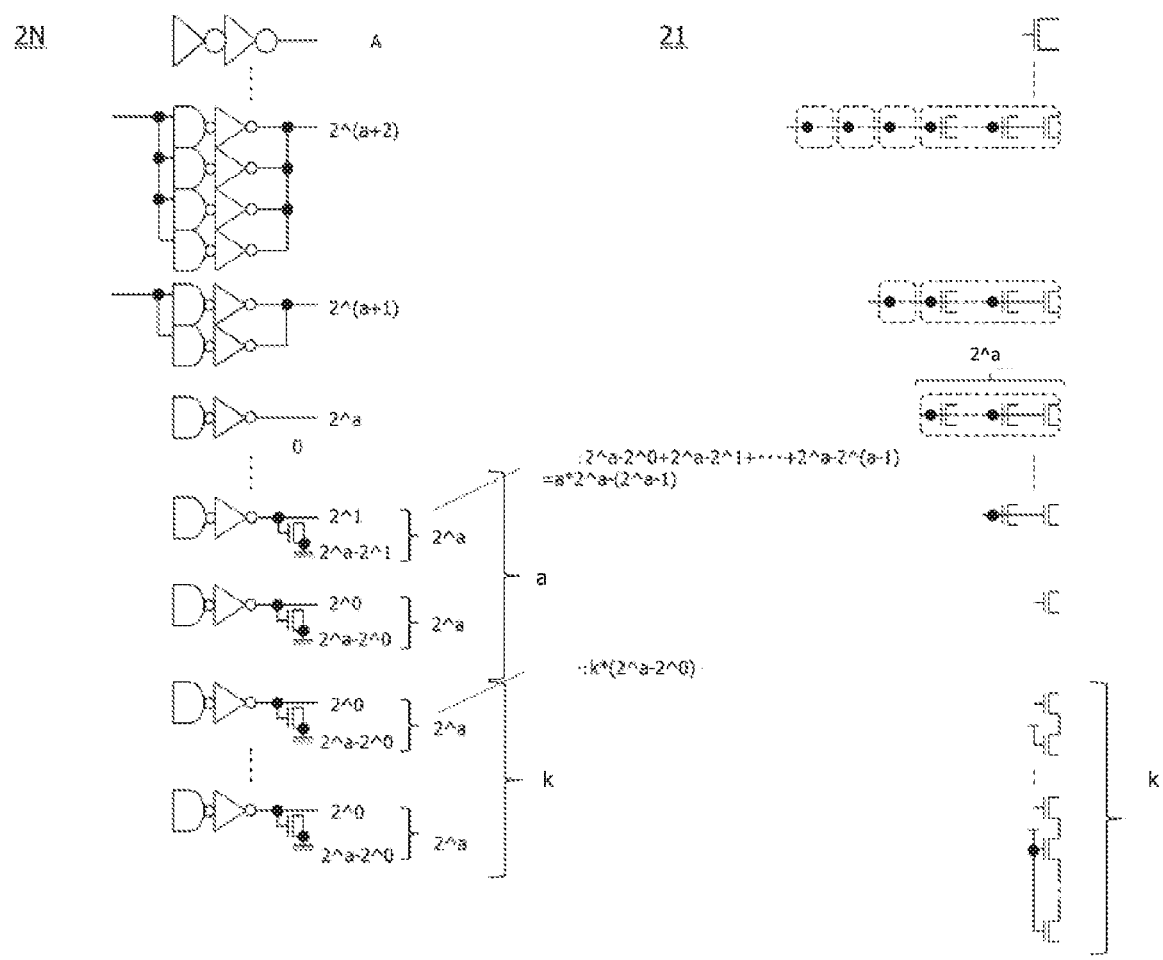
FIG. 8 is a view showing generalized circuits of circuits in accordance with prior arts shown in FIG. 3 and FIG. 5.
Figure 9:
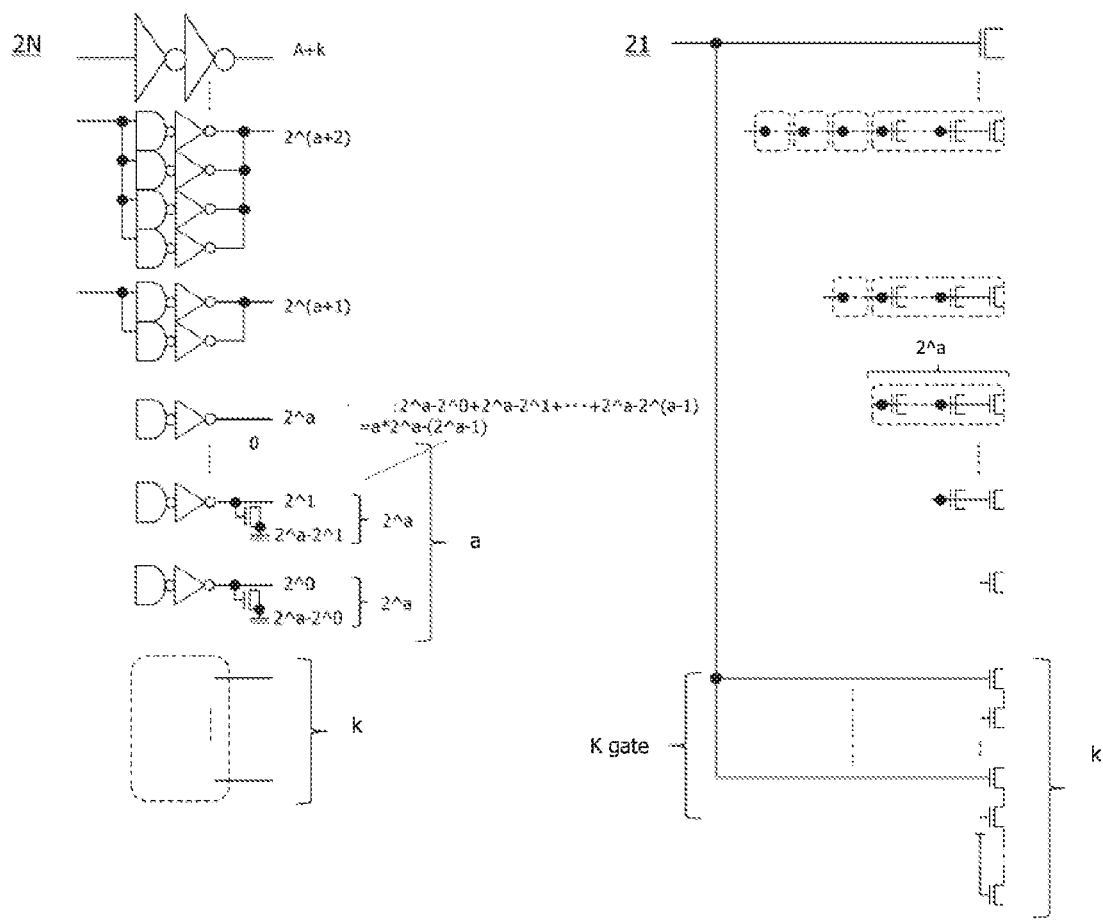
FIG. 9 is a view showing generalized circuits of circuits in accordance with embodiments shown in FIG. 6 and FIG. 7.

Referring to FIG. 8 and FIG. 9, the effects by the first embodiment are generalized and explained.

FIG. 8 is a view showing a generalized circuit of circuits in accordance with the prior art shown in FIG. 3 and FIG. 5. Since the dummy gate capacities are added so as to align fan-outs with respect to a driving operation of output drivers by using $2^n$ as its divisor, in FIG. 8, the gate electrodes of the output drivers and the dummy gate capacities are supposed to have a total sum of $2^a$. With respect to the k number of gates constituted by longitudinally stacked output drivers, since the driving operation is carried out by 1 (=$2^0$) gate, dummy gates corresponding to ($2^a-2^0$) gates are connected thereto. With respect to 1 gate that is solely located also, since 1 (=$2^0$) gate is driven, dummy gates corresponding to ($2^a-2^0$) gates are connected thereto. On a higher stage by one digit, since 2 (=$2^1$) gates of the output drivers are driven, dummy gates corresponding to ($2^a-1^1$) gates are connected thereto. These digit raising processes continue a times in total. In the case when the digit raising process is further carried out one time, since $2^a$ gates are driven with the result that required dummy gates become 0. On the upper digit, the number of the drivers increases by the divisor of $2^n$. Moreover, a resistance-value biasing driver drives the transistor N61.

FIG. 9 is a view showing a generalized circuit of circuits in accordance with the present embodiment shown in FIG. 6 and FIG. 7. Since the dummy gate capacities are added so as to align fan-outs with respect to a driving operation of output drivers by using $2^n$ as its divisor, in FIG. 9, the gate electrodes of the output drivers and the dummy gate capacities are supposed to have a total sum of $2^a$. The k number of longitudinally stacked gates are compatibly used as selectors. There is no increase in the number of elements of the output drivers. There is no increase in pin capacities when seen from the DQ pad 4. The resistance-value biasing drivers are compatibly used so as to drive signals corresponding to data, and since the sizes of the drivers can be freely changed, no dummy gate capacities are required. The processes thereafter are the same as those shown in FIG. 9, and with respect to 1 gate that is solely located, since 1 (=$2^0$) gate is driven, dummy gates corresponding to ($2^a-2^0$) gates are connected thereto. On a higher stage by one digit, since 2 (=$2^1$) gates are driven, dummy gates corresponding to ($2^a-2^1$) gates are connected thereto. These digit raising processes continue a times in total. In the case when the digit raising process is further carried out one time, since $2^a$ gates are driven with the result that required dummy gates become 0. On the upper digit, the number of the drivers increases by the divisor of $2^n$. Moreover, a resistance-value biasing driver drives an (A+k)-numbered gate.

Figure 10:
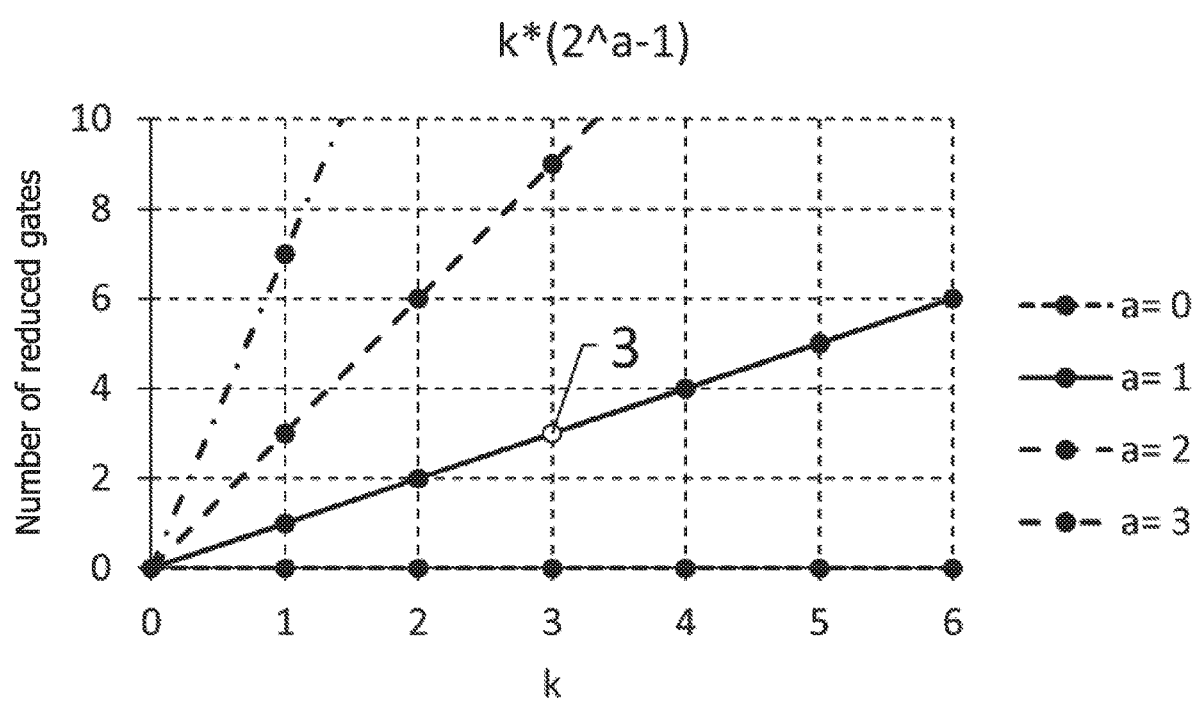
FIG. 10 is a graph for use in explaining effects derived from the first embodiment.

The reduced number of gates driven in the configuration of FIG. 9 relative to the configuration of FIG. 8 is represented by $k \times 2^a - k = k \times (2^a - 1)$. This is the number of gates beneficially saved or reduced in the present embodiment. This is illustrated as a graph in FIG. 10. As the number k of gates that are longitudinally stacked so as to reduce the grain degree of calibration adjustments increases, the number of gates to be beneficially saved or reduced increases in proportion thereto, and when the digit a the unit driver receives so as to reduce the electric current is set to a higher value, the number of gates to be beneficially saved increases in proportion to the number of gates $2^a$ received by the unit driver. Additionally, although no beneficially saved gates are obtained when the number of dummy gates is 0 (a=0) or the number of gates to be longitudinally stacked is 0 (k=0), a≠0 and k≠0 are required upon consideration of increasing the precision.

Figure 11:
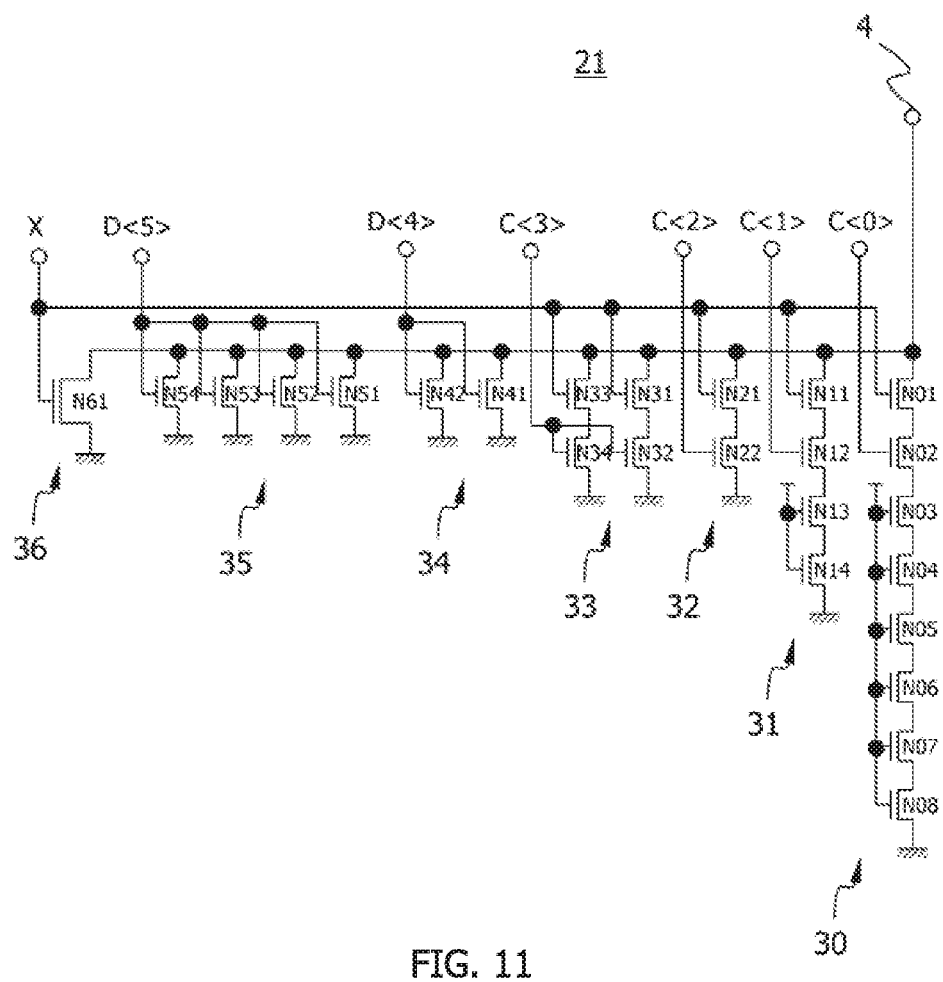
FIG. 11 shows a circuit diagram of a pull-down unit in accordance with a second embodiment.

FIG. 11 is a circuit diagram showing a pull-down unit 21 in accordance with a second embodiment.

In comparison with the pull-down unit 21 shown in FIG. 6, this pull-down unit 21 shown in FIG. 11 is different in the configuration of the output driver 33. Since the other configurations are the same as those of the pull-down unit 21 of the first embodiment shown in FIG. 6, the same elements are indicated by the same reference numerals, and the overlapped explanations will be omitted.

The output driver 33 includes a sub-driver composed of two N-channel type MOS transistors N31 and N32 that are connected in series with each other between the DQ pad 4 and the power supply line V1 and a sub-driver composed of two N-channel type MOS transistors N33 and N34 that are connected in series with each other between the DQ pad 4 and the power supply line V1. The gate electrode of each of the transistors N31 and N33 receives a selection signal X. The gate electrode of each of the transistors N32 and N34 receives a control signal C<3> supplied from the ZQ selector 2N. Therefore, at the time of activation, the impedance of the output driver 33 is substantially coincident with the impedance of the single transistor.

Figure 12:
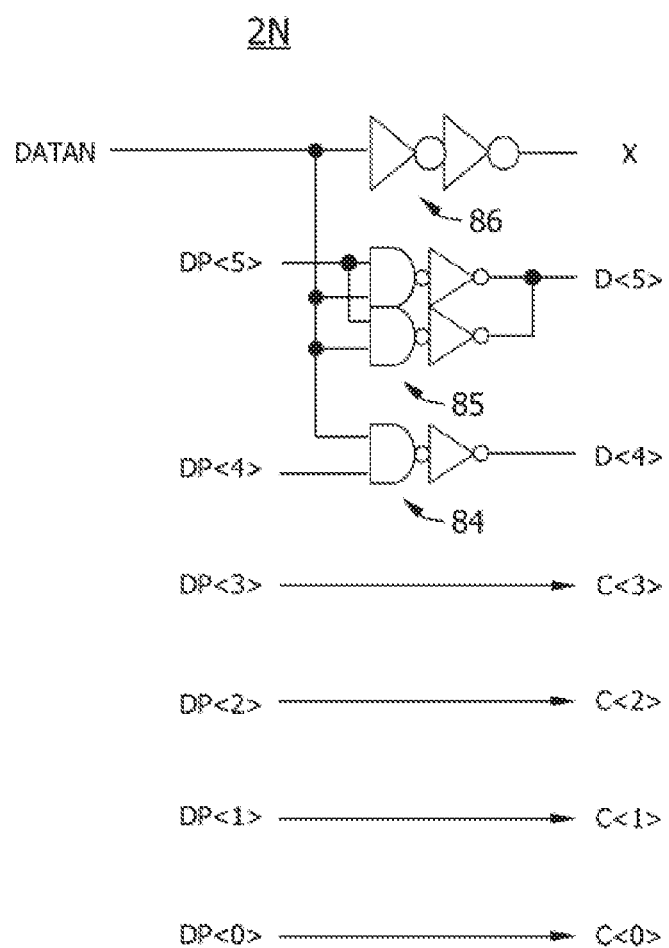
FIG. 12 shows a circuit diagram of a ZQ selector accordance with the second embodiment.

FIG. 12 is a circuit diagram showing a ZQ selector 2N in accordance with the second embodiment.

The ZQ selector 2N shown in FIG. 12 is different from the ZQ selector 2N in accordance with the first embodiment shown in FIG. 7 in that the AND gate circuit 83 and the dummy gate capacity DG3 are omitted. Since the other configurations are the same as those of the ZQ selector 2N shown in FIG. 7, the same elements are indicated by the same reference numerals, and the overlapped explanations will be omitted.

In the ZQ selector 2N shown in FIG. 12, control signals DP<0> to DP<3> forming impedance codes ZQN, as they are, are used as control signals C<0> to C<3>. In this manner, in the present embodiment, no dummy gate capacities are used in the ZQ selector 2N.

In the present embodiment, since the output driver 33 having an impedance of a single transistor is constituted by two sub-drivers that are connected in parallel with each other, with respect to the output driver 33 also, the selection signal X can be used in the same manner as in the output drivers 30 to 32. That is, the output driver 33 is activated when both of the control signal C<3> and the selection signal X are set to the high level.

In the present embodiment, all the dummy capacities DG0 to DG3 that are required for the ZQ selector 2N in accordance with the second reference example shown in FIG. 5 become unnecessary. More specifically, supposing that the gate capacity of the transistor N61 forming the output driver 36 is A and that the gate capacity of each of the transistors forming the output drivers 30 to 35 is B, in the case of the ZQ selector 2N in accordance with the second reference example shown in FIG. 5, the gate capacity of A+14B in total needs to be driven; in contrast, in the case of the ZQ selector 2N in accordance with the second embodiment shown in FIG. 12, only the gate capacity of A+11B in total needs to be driven. That is, the gate capacity corresponding to 3 gates can be reduced. Additionally, the reason that there is no difference in the gate capacity to be driven from that of the first embodiment is because although the load corresponding to 2B gates is reduced by omitting the AND gate 83, the load of the driver 86 is increased by a portion corresponding to 2B gates.

Figure 13:
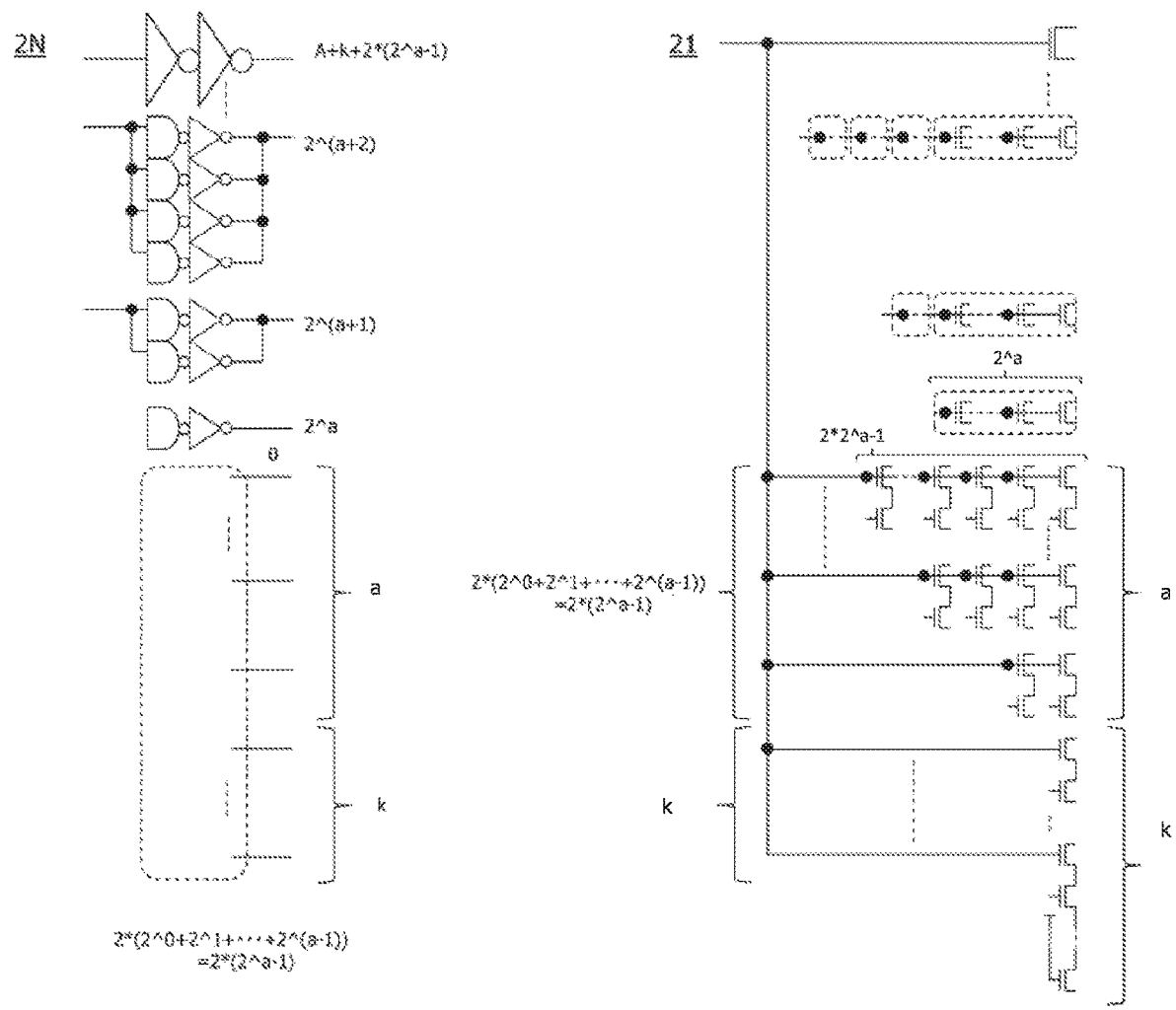
FIG. 13 is a view showing generalized circuits of circuits in accordance with the embodiments shown in FIG. 11 and FIG. 12.

Referring to FIG. 13, the effects by the second embodiment are generalized and explained.

Figure 14:
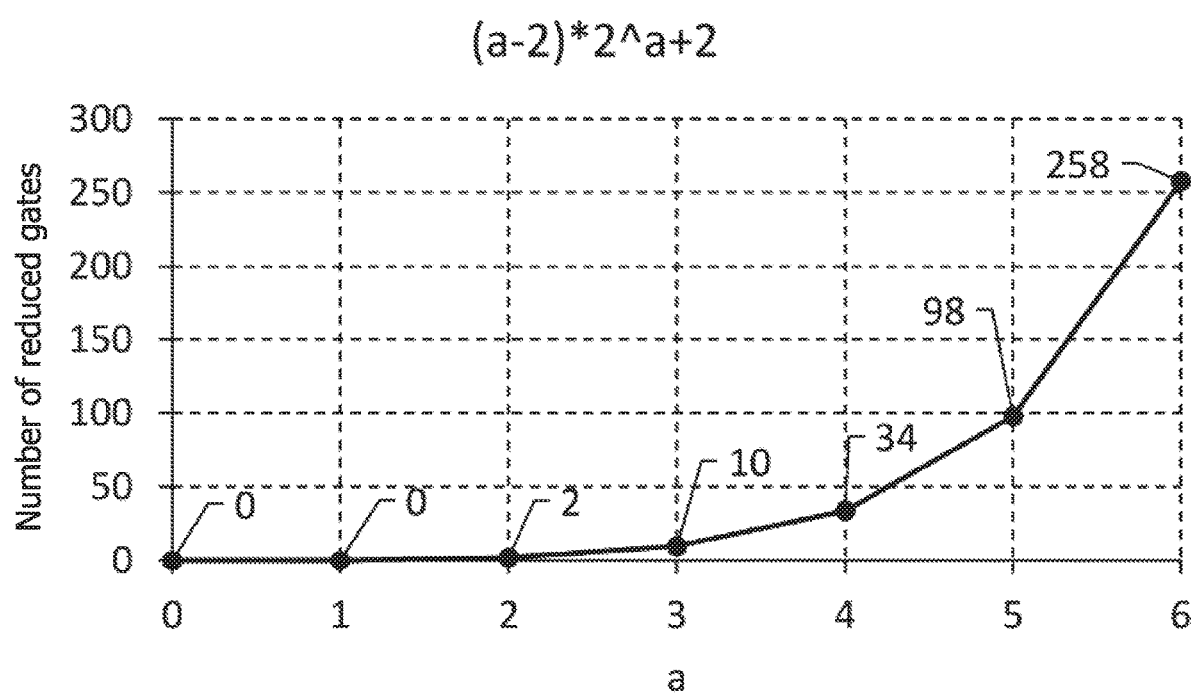
FIG. 14 is a graph for use in explaining effects derived from the second embodiment.

As shown in FIG. 13, the present embodiment aims to improve the a-number of drivers that drive a plurality of gates of output drivers and also have dummy gates. The resistance value biasing driver is allowed to drive 2 (=2×$2^0$) gates having a 2-stage longitudinally stacked configuration in place of the driver that has driven 1 (=$2^0$) gate of the output drivers, and is also allowed to drive 4 (=2×$2^1$) gates having a 2-stage longitudinally stacked configuration in place of the driver that has driven 2 (=$2^1$) gates of the output drivers. In other words, the driver drives 2×$2^{(a-1)}$ gates having a 2-stage longitudinally stacked configuration in place of the driver that has driven $2^{(a-1)}$ gates of output drivers so that it drives 2×$2^{(a-1)}$ gates in total. The number of gates that were driven by the driver to be omitted corresponds to a×$2^a$, and the reduced number of gates that are driven at this portion is represented by a×$2^a$−2×($2^a$−1) =(a−2)×$2^a$+2. This corresponds to the number of gates that are newly saved beneficially by the present embodiment. This is illustrated as a graph in FIG. 14. Up to a=1, there are no saved gates; however, when it becomes 2 or more, the number of gates beneficially saved increases exponentially. This means that it is possible to design the device using a small amount of current as long as the increment of MOS's for the output buffers, the increment of area and the increment of pin capacity are within permissible ranges.

Figure 15:
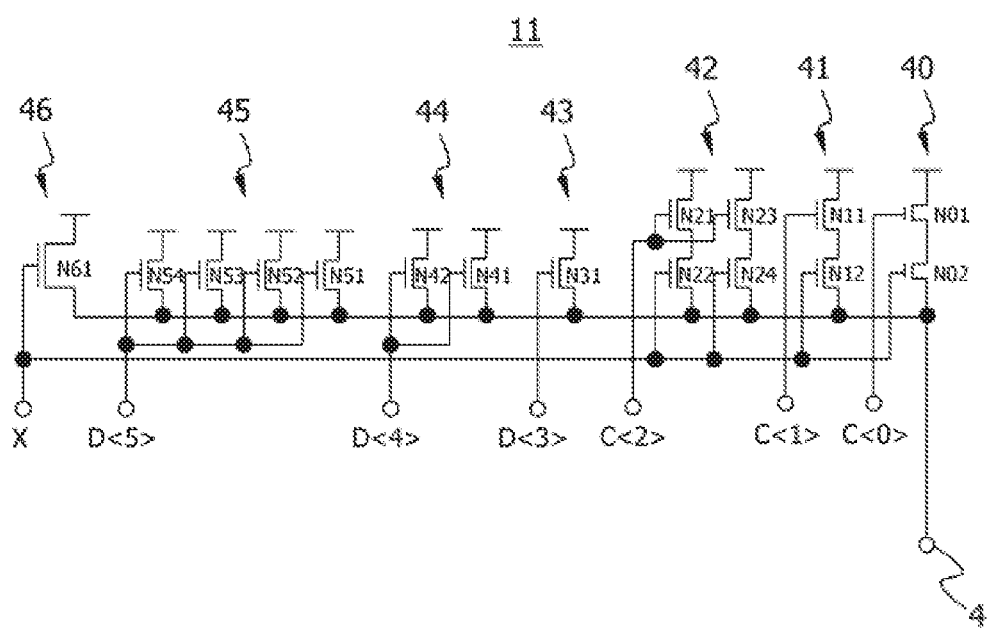
FIG. 15 shows a circuit diagram of a pull-up unit in accordance with a third embodiment.

FIG. 15 is a circuit diagram showing a pull-up unit 11 in accordance with a third embodiment.

As shown in FIG. 15, the pull-up unit 11 in accordance with the present embodiment has a configuration in which a plurality of output drivers 40 to 46 are connected in parallel with each other. The output drivers 40 to 45 are output drivers in which impedances are weighted by powers of 2, and respectively controlled by control signals C<0> to C<2> and D<3> to D<5> supplied from a ZQ selector 2P. On the other hand, the output driver 46, which is a driver for use in biasing a resistance value, is turned ON/OFF irrespective of the control signals C<0> to C<2> and D<3> to D<5>.

The output driver 40 includes two N-channel type MOS transistors N01 and N02 that are connected in series with each other between the DQ pad 4 and the power supply line V2. The gate electrode of the transistor N02 receives a selection signal X. The gate electrode of the transistor N01 receives the control signal C<0> supplied from the ZQ selector 2P. The sizes of the transistors N01 and N02 are ½ of a reference size. Therefore, at the time of activation, the impedance of the output driver 40 becomes 4 times as high as the impedance of the single transistor having the reference size.

The output driver 41 includes two N-channel type MOS transistors N11 and N12 that are connected in series with each other between the DQ pad 4 and the power supply line V2. The gate electrode of the transistor N12 receives the selection signal X. The gate electrodes of the transistor N11 receives the control signal C<1> supplied from the ZQ selector 2P. The sizes of the transistors N11 and N12 are the reference size. Therefore, at the time of activation, the impedance of the output driver 41 becomes 2 times as high as the impedance of the single transistor having the reference size.

The output driver 42 includes a sub-driver composed of two N-channel type MOS transistors N21 and N22 that are connected in series with each other between the DQ pad 4 and the power supply line V2 and a sub-driver composed of two N-channel type MOS transistors N23 and N24 that are connected in series with each other between the DQ pad 4 and the power supply line V2. The gate electrode of each of the transistors N22 and N24 receives the selection signal X. The gate electrode of each of the transistors N21 and N23 receives a control signal C<2> supplied from the ZQ selector 2P. The sizes of the transistors N21 to N24 are the reference size. Therefore, at the time of activation, the impedance of the output driver 42 is equal to the impedance of the single transistor having the reference size.

The output driver 43 includes one N-channel type MOS transistor N31 connected between the DQ pad 4 and the power supply line V2. The gate electrode of the transistor N31 receives a control signal D<3> supplied from the ZQ selector 2P. The size of the transistor N31 is two times the reference size. Therefore, at the time of activation, the impedance of the output driver 43 is a multiple of ½ of the impedance of the single transistor having the reference size.

The output driver 44 includes two N-channel type MOS transistors N41 and N42 that are connected in parallel with each other between the DQ pad 4 and the power supply line V2, The gate electrode of each of the transistors N41 and N42 receives a control signal D<4> supplied from the ZQ selector 2P. The sizes of the transistors N41 and N42 are two times the reference size. Therefore, at the time of activation, the impedance of the output driver 44 is a multiple of ¼ of the impedance of the single transistor having the reference size.

The output driver 45 includes four N-channel type MOS transistors N51 to N54 connected in parallel with each other between the DQ pad 4 and the power supply line V2. The gate electrode of each of the transistors N51 to N54 receives a control signal D<5> supplied from the ZQ selector 2P. The sizes of the transistors N51 to N54 are two times the reference size. Therefore, at the time of activation, the impedance of the output driver 45 is a multiple of ⅛ of the impedance of the single transistor having the reference size.

The output driver 46 includes an N-channel type MOS transistor N61 having a large transistor size, connected between the DQ pad 4 and the power supply line V1. The selection signal X is supplied to the gate electrode of the transistor N61.

The ZQ selector 2P may have the same circuit configuration as that of the ZQ selector 2N shown in FIG. 7. Therefore, the same effects as those of the first embodiment can be obtained, and the number of transistors forming the pull-up unit 11 can be reduced.

Thus, preferred embodiments of the present invention have been described; however, the present invention is not limited to the above-mentioned embodiments, and it is needless to say that various modifications may be made therein within a scope not departing from the gist of the present invention.

For example, in the above-mentioned embodiments, the pull-down unit 21 has the circuit configuration shown in FIG. 6 or FIG. 11, and the pull-up unit 11 has the circuit configuration shown in FIG. 15; however, the pull-up unit 11 may also have the circuit configuration shown in FIG. 6 or FIG. 11. In this case, the pull-up unit 11 may be constituted by P-channel type MOS transistors.

What is claimed is:

1. An apparatus, comprising:
a power supply line;
an output terminal;
a circuit configured to receive a plurality of first control signals and a data signal, the circuit configured to provide a first portion of the plurality of first control signals and further configured to provide a selection signal based on the data signal, wherein the circuit is further configured to provide a second control signal based on a second portion of the plurality of first control signals and the data signal, wherein the circuit comprises a buffer configured to receive the data signal, to buffer the received data signal, and further configured to provide the buffered data signal as the selection signal;
a driver coupled between the power supply line and the output terminal, the driver configured to receive the selection signal and the first portion of the plurality of first control signals.

2. The apparatus of claim 1,
wherein the driver includes first and second transistors coupled in series between the power supply line and the output terminal,
wherein the first transistor between the output terminal and the second transistor comprises a control gate configured to receive the selection signal, and
wherein the second transistor comprises a control gate configured to receive one of the first portion of the plurality of first control signals.

3. The apparatus of claim 2, wherein the driver further includes a third transistor coupled in series between the second transistor and the power supply line, wherein the third transistor comprises a control gate configured to receive a fixed voltage potential.

4. The apparatus of claim 2, wherein the driver is a first driver, the apparatus further comprising:
a second driver coupled between the power supply line and the output terminal and configured to receive the selection signal.

5. The apparatus of claim 1, wherein the driver is a first driver, the apparatus further comprising:
a second driver including a transistor coupled between the power supply line and the output terminal, the transistor comprising a control gate configured to receive the at least one second control signal.

6. The apparatus of claim 1, wherein the circuit comprises:
a gate circuit configured to receive the second portion of the plurality of first control signals and the data signal, and further configured to provide the second control signal.

7. The apparatus of claim 6, wherein the gate circuit includes an AND gate circuit configured to receive the second portion of the plurality of first control signals and the portion of the data signal and further configured to provide the second control signal to an output node.

8. The apparatus of claim 7, wherein the gate circuit further includes a dummy gate capacity coupled to the output node.

9. An apparatus comprising:
a calibration circuit configured to provide an impedance code including first and second control signals; and
a circuit configured to receive a data signal and the impedance code, and further configured to provide a selection signal based on the data signal, the first control signal, and a third control signal based on a combination of the data signal and the second control signal; wherein the circuit further includes a buffer configured to receive the data signal, configured to buffer the received data signal, and further configured to provide a buffered data signal.

10. The apparatus of claim 9, wherein the calibration it is further configured to provide the impedance code responsive to a calibration command.

11. The apparatus of claim 9, further comprising an output buffer circuit,
wherein the circuit is an impedance selector configured to adjust an impedance of the output buffer circuit based on the impedance code.

12. The apparatus of claim 11, wherein the output buffer circuit comprises at least one driver including:
a first transistor comprising a control gate configured to receive the data signal; and
a second transistor comprising a control gate configured to receive the first control signal,
wherein the second and third transistors are coupled in series to each other.

13. An apparatus comprising:
a driver strength selector configured to receive a first data signal and further configured to provide a second data signal;
an impedance selector configured to receive a plurality of control signals and the second data signal, the impedance selector configured to provide a first portion of the plurality of control signals and further configured to provide a selection signal based on the second data signal.

14. The apparatus of claim 13, further comprising a plurality of output drivers that includes a first output driver,
wherein, when the second data signal is activated, at least one of the plurality of output drivers is configured to be activated responsive to the plurality of control signals, and
wherein the first output driver is configured to receive the selection signal and the first portion of the plurality of control signals.

15. The apparatus of claim 14, wherein the first output driver is further configured to receive a fixed voltage potential.

16. The apparatus of claim 14, further comprising:
a mode register configured to receive a mode signal in a command address signal, and further configured to provide a mode signal,
wherein the driver strength selector is configured to activate the second data signal responsive to the mode signal indicative of selecting the driver strength selector.

* * * * *

UNITED STATES PATENT AND TRADEMARK OFFICE
CERTIFICATE OF CORRECTION

PATENT NO. : 11,057,038 B2
APPLICATION NO. : 16/656415
DATED : July 6, 2021
INVENTOR(S) : Tetsuya Arai et al.

It is certified that error appears in the above-identified patent and that said Letters Patent is hereby corrected as shown below:

In the Claims

| Column | Line | Claim | Reads | Should Read |
|---|---|---|---|---|
| 13 | 8 | 10 | wherein the calibration it is further configured | wherein the calibration circuit is further configured |

Signed and Sealed this
Twenty-third Day of April, 2024

Katherine Kelly Vidal
*Director of the United States Patent and Trademark Office*